(12) United States Patent
Yun

(10) Patent No.: US 8,697,483 B2
(45) Date of Patent: Apr. 15, 2014

(54) METHOD OF FORMING CONTACT AND SEMICONDUCTOR DEVICE MANUFACTURED BY USING THE METHOD

(71) Applicant: Dongbu HiTek Co., Ltd., Gyeonggi-do (KR)

(72) Inventor: Ki Jun Yun, Gyeonggi-do (KR)

(73) Assignee: Dongbu HiTek Co., Ltd., Bucheon-si (KR)

( * ) Notice: Subject to any disclaimer, the term of this patent is extended or adjusted under 35 U.S.C. 154(b) by 0 days.

(21) Appl. No.: 13/758,356

(22) Filed: Feb. 4, 2013

(65) Prior Publication Data
US 2013/0277848 A1   Oct. 24, 2013

(51) Int. Cl.
*H01L 21/00* (2006.01)

(52) U.S. Cl.
USPC ............ 438/98; 438/672; 438/675; 438/233; 257/621; 257/774; 257/E21.577; 257/E21.585; 257/E23.011

(58) Field of Classification Search
None
See application file for complete search history.

(56) References Cited

U.S. PATENT DOCUMENTS

| | | | | |
|---|---|---|---|---|
| 8,236,688 B2 * | 8/2012 | Yelehanka et al. | ............ | 438/667 |
| 8,518,823 B2 * | 8/2013 | Huang et al. | .................. | 438/667 |
| 2009/0278230 A1 | 11/2009 | Komuro | | |

FOREIGN PATENT DOCUMENTS

| JP | 2009-277719 | 11/2009 |
|---|---|---|
| KR | 10-2005-0073372 | 7/2005 |
| KR | 10-2006-0088634 | 8/2006 |

* cited by examiner

*Primary Examiner* — Steven Loke
*Assistant Examiner* — Cuong B Nguyen
(74) *Attorney, Agent, or Firm* — Sherr & Jiang, PLLC

(57) ABSTRACT

A method of forming a contact includes forming an inter-layer dielectric layer to cover a gate formed on a semiconductor substrate; and forming a first hole which passes through the inter-layer dielectric layer to expose the gate, a second hole which exposes an active region of the semiconductor substrate, and a third hole which exposes the semiconductor substrate at a preset depth. Further, the method includes forming a shielding layer on the semiconductor substrate including the bottom and sidewalls of the first hole, the second hole, and the third hole; and removing the shielding layer at the bottom of the first hole and the second hole to expose the gate and the active region. Furthermore, the method includes filling the first hole, the second hole, and the third hole with a conductive material.

3 Claims, 4 Drawing Sheets

Figure 1:
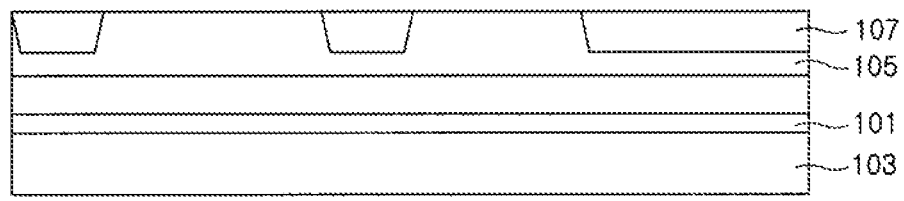

METHOD OF FORMING CONTACT AND SEMICONDUCTOR DEVICE MANUFACTURED BY USING THE METHOD

The present application claims priority to Korean Patent Application No. 10-2012-0041635 (filed on Apr. 20, 2012), which is hereby incorporated by reference in its entirety.

BACKGROUND

Light generated from subjects nature have a unique wavelength value or range of wavelength values. Image sensors may capture an image of a subject using a semiconductor device that is responsive to external energy or light. The pixels of the image sensor may detect light generated from each subject and convert the detected light into electrical values.

Two types of semiconductor image sensors are charge coupled devices (CCD) based on a silicon semiconductor and CMOS image sensors based on sub-micron CMOS (Complementary Metal Oxide Semiconductor) technology.

A CCD may have a structure in which individual MOS capacitors are relatively close to each other and charge carriers may be stored in the capacitors and transferred. However, CCDs may often have limitations in that a complex driving methods may be required during operation, power consumption is relatively high, and the number of mask process steps during manufacturing is relatively large, which may create challenges in implementing a signal processing circuit in a CCD chip. To overcome these possible limitations in CCDs, CMOS image sensors has been further developed and studied.

CMOS image sensors may capture an image using a photodiode (PD) and a MOS transistor in each unit pixel of the CMOS image sensor to detect a signal in a switching manner. CMOS image sensors may have advantages of low production costs, low power consumption, and ease of integration into peripheral circuit chips compared to the CCD. Since CMOS image sensors may be produced by a CMOS manufacturing technique, a CMOS image sensor may be easily integrated into a peripheral system (e.g. amplification and signal processing systems), which may minimize production costs. CMOS image sensors may have high processing speeds and low power consumption, which can be about 1% of CCDs.

In CMOS image sensors, a photodiode may be formed in a semiconductor substrate through ion implantation. The size of the photodiode may be miniaturized to increase the number of pixels without increasing the size of the chip. In other words, a light receiving area of a CMOS image sensor may be designed to be relatively small. However, the stack height may not necessarily be reduced or minimized when the light receiving area is minimized in a CMOS image sensor. Accordingly, a backside-illuminated image sensor may be provided in which a structure or arrangement minimizing the step above the light receiving area and minimizes or substantially eliminates a light interference phenomenon due to metal wiring and/or metal connections.

In general, there are significant efforts to further reduce and/or minimize the size of micro-electronic systems. Chip scale packaging, flip chips, and multichip module may be applied to various electronic systems, such as mobile phones, hand-held computers, and chip cards. There is a general need and/or desire for complex devices having various functions, which often results in increases in the size of chip area to accommodate these various functions. However, chips with structures to accommodate various functions may have relatively low manufacturing yield when integrating a multi-function device, which may cause increases in costs due to complexity of device implementation, as well as other technical limitations. Wiring between sub systems may be limited in terms of performance, multi-functionality, and reliability of micro-electronic systems. These factors may be critical performance bottlenecks in IC generation. Accordingly, 3D integration technology may have significant potential to replace and/or supplement embedded SOC technology.

In 3D integration technology, a super contact may serve as a pad during packaging and a normal contact for general wiring connections may be formed together with a super contact on a single wafer.

A process for manufacturing a backside-illuminated image sensor according to the related art described below. First, a super contact hole may be formed to pass through an inter-layer dielectric layer formed on a semiconductor substrate. A buried insulating layer may serve as an etch stop point during back grinding and to reach near the end of the semiconductor substrate when forming the super contact hole. A shielding layer may be formed at the bottom and sidewalls of the super contact hole for shielding. The inter-layer dielectric layer may be formed of a silicon oxide film ($SiO_2$). The shielding layer may be formed by depositing a silicon nitride film (SiN) and a silicon oxide film. The silicon nitride film may be used because desirable adhesion characteristics between the silicon oxide film and silicon. The shielding layer may also formed on the active region including the gate and the source and drain regions of a semiconductor structure.

A mask pattern may be formed such that the gate and the source and drain regions formed on the active region are exposed. A first normal contact hole and a second normal contact hole may be formed to pass through the exposed region of the shielding layer and the inter-layer dielectric layer on the active region and to respectively expose the gate and the source and drain regions.

A conductive material may be filled in the first normal contact hole, the second normal contact hole, and the super contact hole and planarization may be performed to form a first normal contact, a second normal contact, and a super contact. The super contact hole may be filled with tungsten (W). The backside of the semiconductor substrate may be grounded and etched until the buried insulating layer is exposed, thereby performing backside thinning on the backside of the semiconductor substrate.

When manufacturing a backside-illuminated image sensor of the related art, the normal contact hole may be formed after the super contact hole and the shielding layer are formed. When forming the super contact hole, the super contact hole may be formed to pass through the inter-layer dielectric layer. When forming the normal contact hole, the normal contact hole may be formed to pass through the inter-layer dielectric layer and the shielding layer.

However, from design requirement that require minimization of the weight and size of semiconductor devices, because the diameter of the normal contact hole is relatively small, it may be difficult to expose the inter-layer dielectric layer to the active region. Further, since the shielding layer is included, the depth may increase. Accordingly, in some implementations, the normal contact hole may not be properly formed, such that when a conductive material is filled into the normal contact hole to form the normal contact, defective filling has a significant likelihood of occurring.

SUMMARY

Embodiments relate to a method of forming a contact in which a normal contact hole is formed before forming a super contact hole and a shielding layer, which may suppress an increase in depth of the normal contact hole in passing through an inter-layer dielectric layer when forming the normal contact hole in a semiconductor device.

Embodiments include at least one of the following: (1) forming an inter-layer dielectric layer to cover a gate formed on a semiconductor substrate; (2) forming a first hole which passes through the inter-layer dielectric layer to expose the gate, a second hole which exposes an active region of the semiconductor substrate, and a third hole which exposes the semiconductor substrate at a predetermined depth; (3) forming a shielding layer on and/or over the semiconductor substrate including the bottom and sidewalls of the first hole, the second hole, and the third hole; (4) removing the shielding layer at the bottom of the first hole and the second hole to expose the gate and the active region; and (5) filling the first hole, the second hole, and the third hole with a conductive material.

In embodiments, the forming of the first hole to the third hole may be performed such that the third hole is formed through a separate step from the first hole and the second hole. In embodiments, the exposing the gate and the active region may includes forming a mask pattern on the semiconductor substrate, on which the shielding layer is formed, to expose the first hole and the second hole; and etching the bottom of the first hole and the bottom of the second hole at a preset depth using the mask pattern.

In accordance with embodiments, a semiconductor device may include at least one of: (1) an inter-layer dielectric layer configured to be formed to cover a gate formed on a semiconductor substrate; (2) a first contact configured to pass through the inter-layer dielectric layer and to be connected to the gate; (3) a second contact configured to pass through the inter-layer dielectric layer and to be connected to an active region of the semiconductor substrate; (4) a third contact configured to pass through the inter-layer dielectric layer and be connected to a preset depth of the semiconductor substrate; and (5) a shielding layer configured to be formed at the sidewall of the first contact, the sidewall of the second contact, and the sidewall and bottom of the third contact.

In embodiments, the shielding layer may include a nitride film and/or an oxide film.

In embodiments, the normal contact hole may be formed before forming the super contact hole and the shielding layer, which may suppress an increase in depth to pass through the inter-layer dielectric layer when forming the normal contact hole. Therefore, in accordance with embodiments, it may be possible to prevent or substantially prevent a normal contact hole from being formed improperly or to suppress defective filling when the conductive material is filled in the normal contact hole to form the normal contact.

DRAWINGS

The above and other features of embodiments will become apparent from the following description of embodiments given in conjunction with the accompanying drawings, in which:

Example FIGS. 1 to 8 are cross sectional views illustrating a method of manufacturing a backside-illuminated image sensor including forming a contact, in accordance with embodiments.

DESCRIPTION

Advantages and features of the invention and methods of accomplishing the same may be understood more readily by reference to the following detailed description of embodiments and the accompanying drawings. The invention may, however, be embodied in many different forms and should not be construed as being limited to the embodiments set forth herein. Rather, these embodiments are provided so that this disclosure will be thorough and complete and will fully convey the concept of the invention to those skilled in the art, and the invention will only be defined by the appended claims.

In the following description of the present invention, if the detailed description of the already known structure and operation may confuse the subject matter of the present invention, the detailed description thereof will be omitted. The following terms are terminologies defined by considering functions in the embodiments of the present invention and may be changed operators intend for the invention and practice. Hence, the terms need to be defined throughout the description of the present invention.

FIGS. 1 to 8 are cross sectional views illustrating a method of manufacturing a backside-illuminated image sensor from among semiconductor devices manufactured using a method of forming a contact in accordance with an embodiment of the invention. First, the configuration of a semiconductor device in accordance with the embodiment of the invention will be described with reference to FIG. 8.

Figure 8:
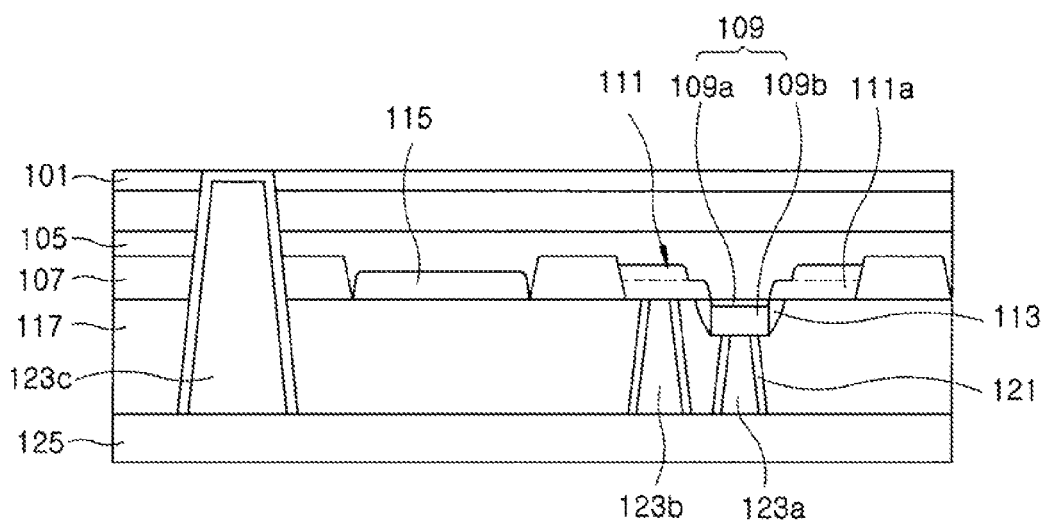

As shown in FIG. 8, a semiconductor device in accordance with the embodiment of the invention includes an inter-layer dielectric layer 117 which is formed to cover a gate electrode 109 formed on a semiconductor substrate 103, a first normal contact 123a which passes through the inter-layer dielectric layer 117 and is connected to the gate electrode 109, a second normal contact 123b which passes through the inter-layer dielectric layer 117 and is connected to a source/drain region 111 as an active region formed on the semiconductor substrate 103, a super contact 123c which passes through the inter-layer dielectric layer 117 and extends to a preset depth of the semiconductor substrate 103, and a shielding layer 121 which is formed at the sidewall of the first normal contact 123a, at the sidewall of the second normal contact 123b, and at the sidewall and bottom of the super contact 123c. The shielding layer 121 is formed of either a nitride film or an oxide film, or is formed of a deposited film including a nitride film or an oxide film.

In the semiconductor device according to the embodiment of the invention, the shielding layer 121 is formed in not only the super contact 123c but also the first normal contact 123a and the second normal contact 123b.

Hereinafter, the method of manufacturing a backside-illuminated image sensor from among semiconductor devices manufactured using the method of forming a contact according to the embodiment of the invention will be described with reference to FIGS. 1 to 8.

First, referring to FIG. 1, a first conduction-type epitaxial layer 105 may be formed on the front side of a semiconductor substrate 103, in which a buried insulating layer 101 is formed of a silicon oxide film (SiO$_2$) or the like, using a silicon growth method including epitaxial growth and annealing, and an isolation film 107 is locally formed in the semiconductor substrate 103, on which the epitaxial layer 105 is formed, to define an active region and an inactive region.

Figure 2:
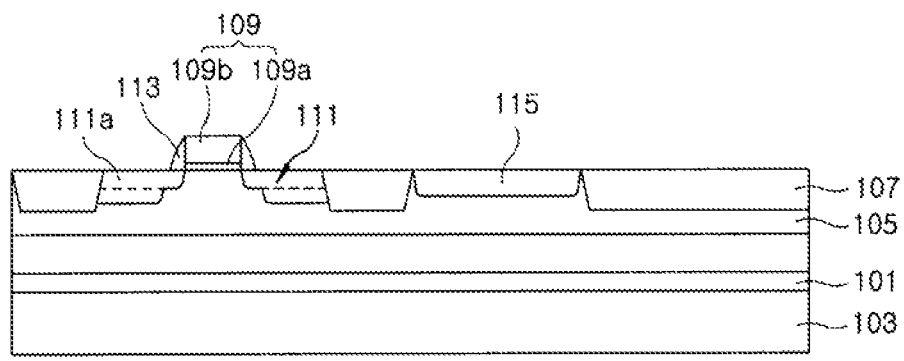

Referring to FIG. 2, a gate insulating film 109a and a gate conductive film 109b may be formed on the semiconductor substrate 103 and etched to form the gate electrode 109, and LDD (Lightly Doped Drain) regions 111a of a second conduction type are formed in the semiconductor substrate 103 exposed on both sides of the gate electrode 109. A spacer 113 may be formed on both sides of the gate electrode 109, and a photodiode 115 is formed.

Heavily doped source and drain regions 111 of a second conduction type may be formed in the semiconductor substrate 103 exposed on both sides of the spacer 113. At this time, the source and drain regions 111 may be formed to be more heavily doped than the LDD regions 111a.

Figure 3:
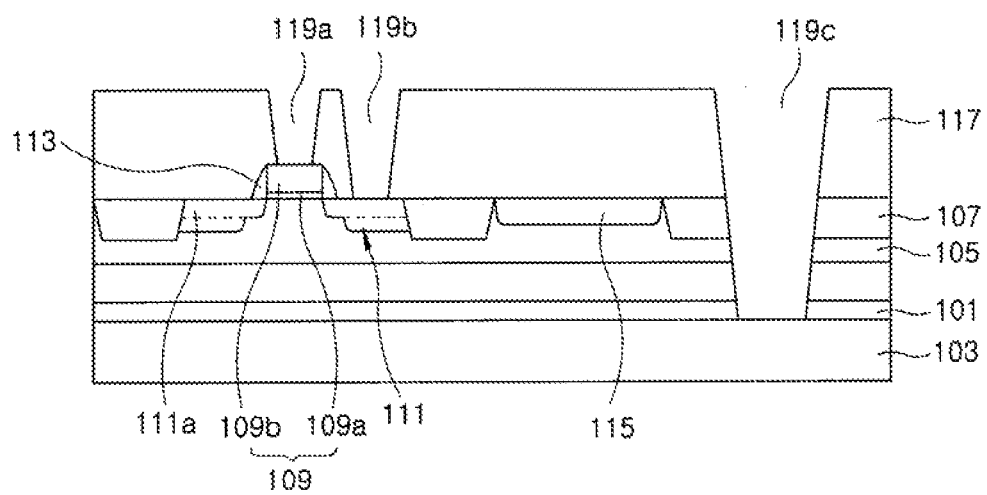

Referring to FIG. 3, an inter-layer dielectric layer 117 may be formed to cover the semiconductor substrate 103 including the gate electrode 109, the spacer 113, the photodiode 115, and the source and drain regions 111. At this time, the inter-layer dielectric layer 117 may be formed of an oxide film, for example, a silicon oxide film, and specifically, may be formed of one selected from BPSG (BoroPhosphoSilicate Glass), PSG (PhosphoSilicate Glass), BSG (BoroSilicate Glass), USG (Un-doped Silicate Glass), and TEOS (Tetra Ethyl Ortho Silicate), or a stacked film thereof. The inter-layer dielectric layer 117 may be formed of a film, such as a SOD (Spin On Dielectric) film, which is coated by spin coating.

Local etching may be performed on the entire surface of the semiconductor substrate 103 on which the inter-layer dielectric layer 117 is formed. Thus, a first normal contact hole 119a and a second normal contact hole 119b may be formed to pass through the inter-layer dielectric layer 117 and to respectively expose the gate electrode 109 and the source/drain region 111, and a super contact hole 119c is formed to pass through the inter-layer dielectric layer 117, the epitaxial layer 105, and the buried insulating layer 101 and to reach the semiconductor substrate 103. When the isolation film 107 may be formed in the pad region, the super contact hole 119c is formed to pass through the isolation film 107. At this time, while dry etching or wet etching may be performed, dry etching is preferably performed so as to form a vertical profile.

Figure 4:
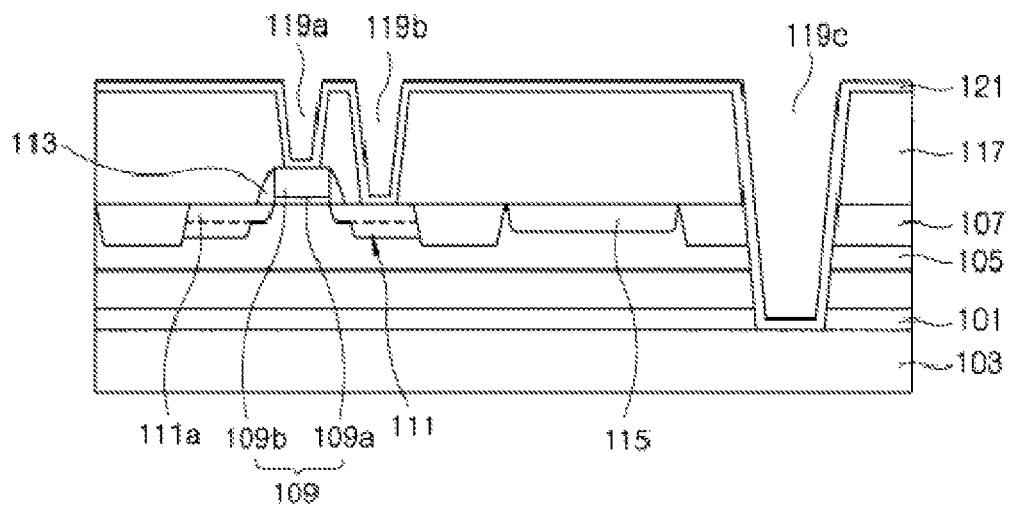

Referring to FIG. 4, the shielding layer 121 may be formed at the bottom and sidewalls of the first normal contact hole 119a, the second normal contact hole 119b, and the super contact hole 119c and on the semiconductor substrate 103. The shielding layer 121 may be formed of either a nitride film or an oxide film, or may be formed of a deposited film including a nitride film or an oxide film. For example, a silicon nitride film (SiN) and a silicon oxide film ($SiO_2$) may be deposited to form the shielding layer 121.

Figure 5:
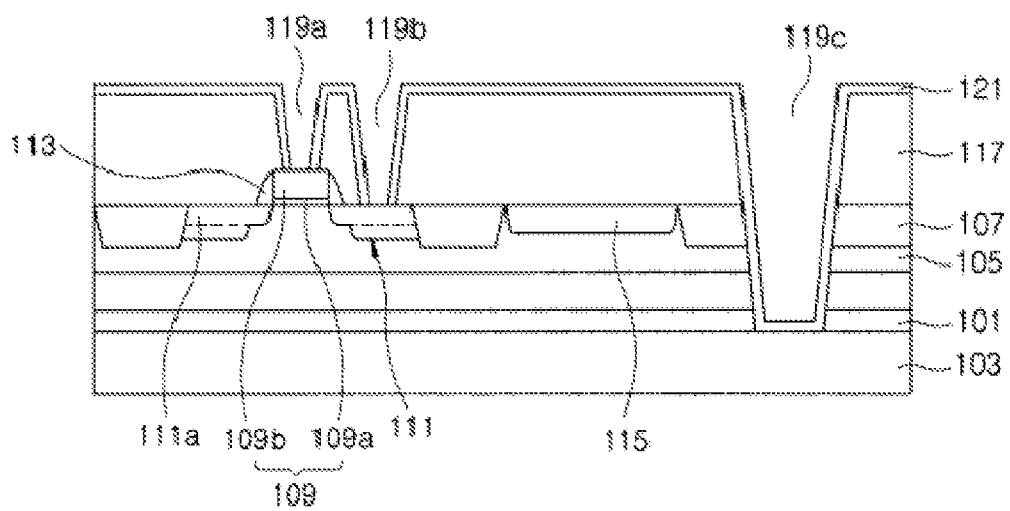

Referring to FIG. 5, a mask pattern may be formed on the semiconductor substrate 103, on which the shielding layer 121 is formed, to expose the first normal contact hole 119a and the second normal contact hole 119b only. The shielding layer 121 which is formed at the bottom of the exposed first normal contact hole 119a and second normal contact hole 119b may be removed to expose the gate electrode 109 and the source/drain region 111.

Figure 6:
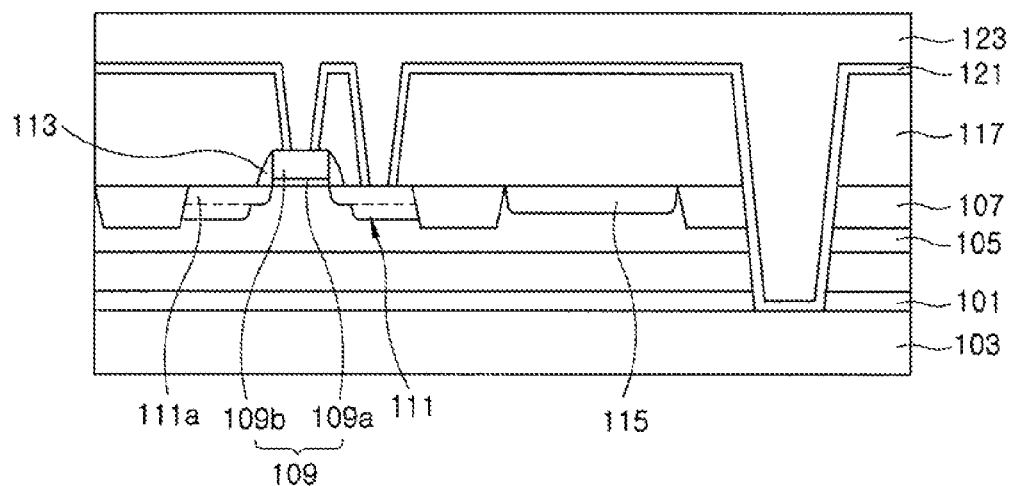

Referring to FIG. 6, the first normal contact hole 119a, the second normal contact hole 119b, and the super contact hole 119c in which the shielding layer 121 may be formed are filled with a conductive material 123. At this time, examples of the conductive material may include a polysilicon film doped with impurity ions, copper (Cu), platinum (Pt), tungsten (W), aluminum (Al), and an alloy film containing these materials. For example, when tungsten is used as the conductive material, chemical vapor deposition or atomic layer deposition may be performed, and when aluminum is used as the conductive material, chemical vapor deposition may be performed. When copper is used as the conductive material, electroplating or chemical vapor deposition may be performed.

Figure 7:
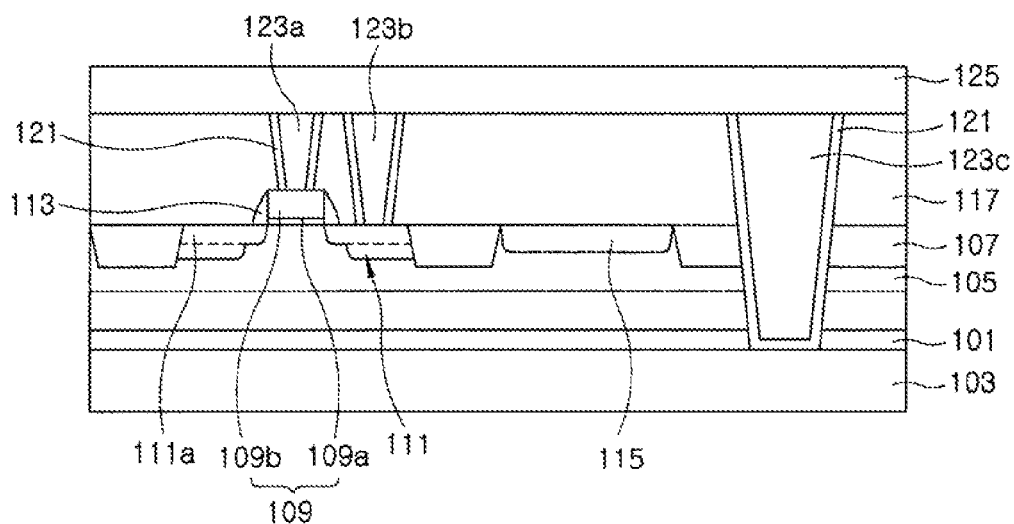

Referring to FIG. 7, planarization may be performed on the entire surface of the semiconductor substrate 103, in which the first normal contact hole 119a, the second normal contact hole 119b, and the super contact hole 119c are filled, to form the first normal contact 123a, the second normal contact 123b, and the super contact 123c.

A support substrate 125 may be stacked on the front side of the semiconductor substrate 103 in which the normal contact 123a, the second normal contact 123b, and the super contact 123c are formed, and the support substrate 131 and the semiconductor substrate 103 are bonded. At this time, as the bonding method, one of oxide film-oxide film bonding, oxide film-silicon bonding, oxide film-metal film bonding, oxide film-adhesive member-oxide film bonding, and oxide film-adhesive member-silicon bonding may be used.

Referring to FIG. 8, the backside of the semiconductor substrate 101 bonded to the support substrate 125 may be ground at a prescribed thickness, and backside thinning may be performed to etch the ground semiconductor substrate 103 using a hydrogen fluoride (HF)-based chemical with the buried insulating layer 101 as an etching stop point. At this time, spin etching may be performed using a chemical in which a hydrogen fluoride and an ammonium fluoride are mixed.

A conductive material for another pad may be formed on the exposed semiconductor substrate 103. In this case, examples of the conductive material include metal and a mixed film in which at least two kinds of metal are mixed.

Although subsequent steps are not shown in the drawings, forming a color filter and forming a micro-lens may be selectively performed.

A protective film may be formed on the semiconductor substrate 103, and a color filter may be formed on the protective film corresponding to the photodiode 115. A lower planarization film may be formed on the protective film before forming the color filter.

Next, an upper planarization film may be formed to cover the color filter, and a micro-lens may be formed on the upper planarization film to correspond to the color filter.

A low-temperature oxide film is formed on the protective film including the micro-lens.

Next, packing may be performed to package the semiconductor substrate 103 and the support substrate 125. At this time, packing may include wire bonding and sawing. Wire bonding may be performed by connecting a pad and an external chip through wires.

While the invention has been shown and described with respect to the embodiments, the present invention is not limited thereto. It will be understood by those skilled in the art that various changes and modifications may be made without departing from the scope of the invention as defined in the following claims.

What is claimed is:

1. A method of forming a contact, the method comprising:
   forming an inter-layer dielectric layer to cover a gate formed on a semiconductor substrate;
   forming a first hole which passes through the inter-layer dielectric layer to expose the gate, a second hole which exposes an active region of the semiconductor substrate, and a third hole which exposes the semiconductor substrate at a preset depth;
   forming a shielding layer on the semiconductor substrate including the bottoms and sidewalls of the first hole, the second hole, and the third hole;
   removing the shielding layer at the bottoms of the first hole and the second hole to expose the gate and the active region; and
   filling the first hole, the second hole, and the third hole with a conductive material.

2. The method of claim 1, wherein said forming the first hole to the third hole is performed such that the third hole is formed through a separate step from the first hole and the second hole.

3. The method of claim 1,
wherein said exposing the gate and the active region includes
forming a mask pattern on the semiconductor substrate, on which the shielding layer is formed, to expose the first hole and the second hole; and
etching the shielding layer at the bottoms of the first and second holes at a preset length using the mask pattern.

\* \* \* \* \*